United States Patent [19]

Kurihara

[11] Patent Number: 4,459,560
[45] Date of Patent: Jul. 10, 1984

[54] PLURAL PHASE LOCKED LOOP FREQUENCY SYNTHESIZER

[75] Inventor: Takenori Kurihara, Gyoda, Japan

[73] Assignee: Takeda Riken Kogyo Kabushikikaisha, Tokyo, Japan

[21] Appl. No.: 339,613

[22] Filed: Jan. 15, 1982

[30] Foreign Application Priority Data

Jan. 28, 1981 [JP] Japan .................. 56-11247

[51] Int. Cl.³ .............. H03L 7/118; H03L 7/122
[52] U.S. Cl. .................................. 331/2; 331/11; 331/14; 331/17; 331/25; 331/DIG. 2
[58] Field of Search ............... 331/2, 10, 11, 12, 14, 331/17, 18, 25, DIG. 2

[56] References Cited

U.S. PATENT DOCUMENTS

| 4,360,788 | 11/1982 | Erps et al. | 331/25 X |
| 4,388,597 | 6/1983 | Bickley et al. | 331/25 X |
| 4,409,563 | 10/1983 | Vandegraaf | 331/DIG. 2 X |

FOREIGN PATENT DOCUMENTS

53927  4/1980  Japan ..................... 331/2

Primary Examiner—Siegfried H. Grimm
Assistant Examiner—Bob Pascal
Attorney, Agent, or Firm—Staas & Halsey

[57] ABSTRACT

First and second frequency signals are frequency converted by a frequency converter and the frequency-converted output and the output from a variable frequency oscillating means are phase compared by a digital phase comparator. The phase-compared output controls the variable frequency oscillating means, constituting a first phase lock loop of a wide capture range. The output from the variable frequency oscillating means is frequency converted by the first frequency signal and the converted output and the second frequency signal are phase compared by an analog phase comparator. By the phase-compared output is controlled the variable frequency oscillating means, constituting a second phase lock loop of a narrow capture range but a large loop gain. The output frequency of the variable frequency oscillating means is varied by changing the setting of the frequencies of the first and second frequency signals.

17 Claims, 12 Drawing Figures

PLURAL PHASE LOCKED LOOP FREQUENCY SYNTHESIZER

BACKGROUND OF THE INVENTION

The present invention relates to a frequency synthesizer for producing a signal of a preset frequency, and more particularly to a frequency synthesizer which is employed, for example, in a local signal generator for determining a receiving signal frequency of a spectrum analyzer, a signal generator for measuring frequency characteristics of various transmitting apparatuses and what is called a signal generator for generating a predetermined frequency signal for similar measuring or detecting use.

In a conventional frequency synthesizer, an analog signal corresponding to a set frequency is produced by a D-A converter and the oscillation frequency of a voltage-controlled oscillator is controlled by the analog signal to oscillate substantially at the set frequency. The output from the voltage-controlled oscillator is frequency converted by an output signal from a frequency signal generator and the frequency-converted output and a reference frequency signal are phase compared and, by the phase-compared output, the voltage-controlled oscillator is controlled to set up a phase lock loop. When the set frequency is changed, the output signal frequency of the frequency signal generator is also altered correspondingly. With the phase lock loop, it is possible to obtain from the voltage-controlled oscillator an output which is of a correct frequency dependent upon the frequency accuracy of the reference frequency signal, and this output is of low noise. With such a conventional frequency synthesizer, however, it is difficult to vary its output frequency over a wide range. That is to say, since the oscillation frequency-control voltage characteristic of the voltage-controlled oscillator is nonlinear and has hysteresis, and since the phase lock loop has a narrow capture range to provide a large loop gain in its locked-in state, it may happen in some cases that the oscillation frequency of the voltage-controlled oscillator is not within the capture range of the phase lock loop when the set frequency has been altered.

To get over this problem, it has been considered to adopt such an arrangement as follows: The output from a voltage-controlled oscillator is frequency divided by a variable frequency divider, the frequency-divided output is phase compared with a reference frequency signal and the voltage-controlled oscillator is controlled by the phase-compared output, thus constituting a first phase lock loop, and, further, the output from the voltage-controlled oscillator is phase compared with a frequency signal from a frequency signal generator and the variable frequency oscillator is controlled by the phase-compared output, thus constituting a second phase lock loop. The second phase lock loop has a larger loop gain in its locked-in state than does the first phase lock loop. The oscillation frequency of the voltage-controlled oscillator is varied by changing the frequency of the frequency signal from the frequency-signal generator with the frequency dividing ratio of the frequency divider. In this case, the voltage-controlled oscillator can be made to oscillate at a set frequency but, in order to enlarge the capture range, it is necessary to augment the frequency dividing ratio of the variable frequency divider, resulting in the loop gain of the first phase lock loop becoming small. For reducing the changing step of frequency with which the set frequency is altered, it is necessary that the cutoff frequency of a loop filter in the first phase lock loop be selected low and this brings about the defect of much time being needed for the first phase lock loop to reach its locked-in state after changing the set frequency.

SUMMARY OF THE INVENTION

It is therefore an object of the present invention to provide a frequency synthesizer which is capable of producing an output frequency exactly in agreement with a set frequency and of very few noise components, i.e. of high frequency purity, and which permits frequency setting over a wide frequency range.

Another object of the present invention is to provide a frequency synthesizer which can be set to a set frequency and is able to vary the set frequency with narrow steps and which permits frequency setting over a wide frequency range.

Yet another object of the present invention is to provide a frequency synthesizer which is free from the fear that the phase of its output signal varies at low frequencies.

According to the present invention, the output from a variable frequency oscillating means is applied to a first phase comparator and a second frequency signal from a second frequency signal generating means is frequency converted by a first frequency signal from a first frequency signal generating means in a first frequency converter. The frequency-converted output is phase compared with the output from the variable frequency oscillating means in the first phase comparator. By the phase-compared output is controlled the output frequency of the variable frequency oscillating means. A first phase lock loop is constituted by the variable frequency oscillating means and the first phase comparator, and the variable frequency oscillating means is controlled so that the frequencies of the two inputs to the first phase comparator may coincide with each other. The first phase comparator is what is called a digital type and the first phase lock loop has a wide capture range. For simplifying the arrangement of the first phase comparator, it is also possible that the two inputs thereto are phase compared after being frequency divided using the same frequency dividing ratio.

Further, the output from the variable frequency oscillating means is frequency converted by the first frequency signal from the first frequency signal generating means in a second frequency converter and the converted output is phase compared with the first frequency signal in a second phase comparator. By the phase-compared output is controlled the variable frequency oscillating means. A second phase lock loop is set up by the variable frequency oscillating means, the second phase comparator and the second frequency converter, and the variable frequency oscillating means is controlled so that the two inputs to the second phase comparator may have the same frequency. The second phase comparator is what is called an analog type and the second phase lock loop has a narrow capture range and a large loop gain in its locked state, as compared with the first phase lock loop. As a result of this, when changing the frequency of the first frequency signal from the first frequency signal generating means by first frequency setting means, even if the newly set frequency is appreciably distant from the output frequency of the variable frequency oscillating means at that time, the latter is locked into the former by the operations of the first and second phase lock loops. By virtue of the operation of the second phase lock loop, it is possible to obtain a high-purity output of high frequency accuracy and low noise.

By such an arrangement that the frequency of the second frequency signal from the second frequency signal generating means can be varied by second frequency setting means with narrower steps than those for the frequency variation by the first frequency setting means, it is also possible to vary the output from the variable frequency oscillating means with narrow steps. In such a case, since a variable frequency divider of a large frequency dividing ratio is not employed, the loop gain can be made large and the cutoff frequency of the loop filter need not be made so low, and consequently, the locked-in state can be obtained in a short time. In general, when the first phase lock loop is in the locked-in state, the two inputs to the first phase comparator are in phase and when the second phase lock loop is in the locked-in state of maximum loop gain, the two inputs to the second phase comparator are phased 90° apart. But if the first and second phase lock loops are always held in their closed state, the second phase lock loop does not necessarily become steady-state with the maximum loop gain when operating the frequency synthesizer or changing the set frequency. Consequently, the switch may sometimes be inserted between the output side of the second phase comparator and a control input side of the variable frequency oscillating means so that the second phase lock loop may start its operation after the first phase lock loop becomes locked-in.

With such insertion of the switch, the first phase lock loop is put in its locked-in state and when putting the second phase lock loop in operation by turning ON the switch, the output phase of the variable frequency oscillating means may in some cases undergo variations at low frequencies owing to the characteristics of the first and second phase comparators. But this can be avoided by such an arrangement as follows. That is, the second frequency signal generating means is formed by a simple-structured first frequency signal generator the output frequency of which is varied by a control signal, such as a voltage-controlled oscillator, and a second frequency signal generator. The output from the first frequency signal generator is supplied to the first frequency converter and the output from the second frequency signal generator is fed to the second phase comparator. The first frequency signal generator is controlled by the output from the second phase comparator. If the set frequency and the output frequency of the variable frequency oscillating means are far apart, the latter frequency is out of the capture range of the second phase lock loop, so that the first frequency signal generator is not controlled by the output from the second phase comparator. Therefore, only the first phase lock loop approaches its locked-in state and, as a result of this, the second phase lock loop also operates finally and reaches the locked-in state. At this time, the first frequency signal generator is also controlled by the output from the second phase comparator and the output frequency of the former coincides with the output signal frequency of the second frequency signal generator.

While in the above the output from the variable frequency oscillating means is applied to the second phase comparator after being frequency converted by the first frequency signal, it is also possible to provide the output from the variable frequency oscillating means directly to the second phase comparator and to supply the second frequency signal to the second phase comparator after frequency converting it by the first frequency signal. Incidentally, the variable frequency oscillating means may be a voltage-controlled oscillator itself, and it is also possible to frequency convert the output from the voltage controlled oscillator by a third frequency signal and to use the frequency-converted output as the output from the variable frequency oscillating means.

DESCRIPTION OF THE PREFERRED EMBODIMENTS

To facilitate a better understanding of the present invention, a description will be given first, with reference to FIG. 1, of a conventional frequency synthesizer. The outputs from a voltage-controlled oscillator (hereinafter referred to as VCO) 11 and a frequency signal generator 12 are applied to a frequency converter 13 to derive therefrom a signal of a frequency which is a difference, $f_0-f_{r1}$, between the output frequency $f_0$ of the VCO 11 and the output frequency $f_{r1}$ of the signal generator 12. The output signal from the frequency converter 13 and a reference signal of a frequency $f_{r0}$ at a terminal 14 are phase compared by a phase comparator 15. The phase-compared output corresponding to the phase difference between the two signals is supplied as a control signal to the VCO 11 via an adder 16. What is called a phase locked loop (hereinafter referred to as PLL) 17 is constituted via the illustrated route [VCO 11–frequency converter 13–phase comparator 15–adder 16–VCO 11].

For setting an oscillation frequency, a digital value is set in a setting circuit 18 and the digital value is converted by a D-A converter 19 into an analog voltage, which is provided to the adder 16. The frequency signal generator 12 is designed so that its output signal frequency can be altered. The PLL 17 is large in loop gain when it is in its locked-in state but narrow in capture range. Accordingly, a frequency desired to be obtained is set in a setter 22 and the same frequency as the set one is set in the setting circuit 18 and then a voltage, which is substantially equal to a voltage necessary for the VCO 11 to oscillate at the set frequency, is applied as a control input to the VCO 11 via the D-A converter 19, whereby the PLL 17 is permitted to pull the oscillation frequency of the VCO 11 into the set frequency. The output from the VCO 11 is taken out from a terminal 21 and its frequency $f_0$ is $f_{r0}+f_{r1}$ when the frequency set in each of the setting circuit 18 and the setter 22 is zero.

The output voltage of the D-A converter 19 which is yielded in response to the value set in the setting circuit 18 undergoes linear variations but the oscillation frequency of the VCO 11 may not linearly vary with respect to its control voltage in some cases and the oscillation frequency-control voltage characteristic of the VCO 11 may sometimes have hysteresis. In the case where the oscillation frequency-control voltage characteristic is nonlinear but has no hysteresis, it is possible to pre-correct the relationship between the set value of the setting circuit 18 and the control voltage; however, a complex correction circuit is needed therefor and it is difficult to completely correct the nonlinearity of the oscillation frequency-control voltage characteristic. Furthermore, if the correction is not sufficient, then the PLL 17 cannot lock the oscillation frequency of the VCO 11 into the set frequency, resulting in a signal of a frequency different from the set frequency. When the oscillation frequency-control voltage characteristic of the VCO 11 has hysteresis, it is difficult to correct.

Figure 2:
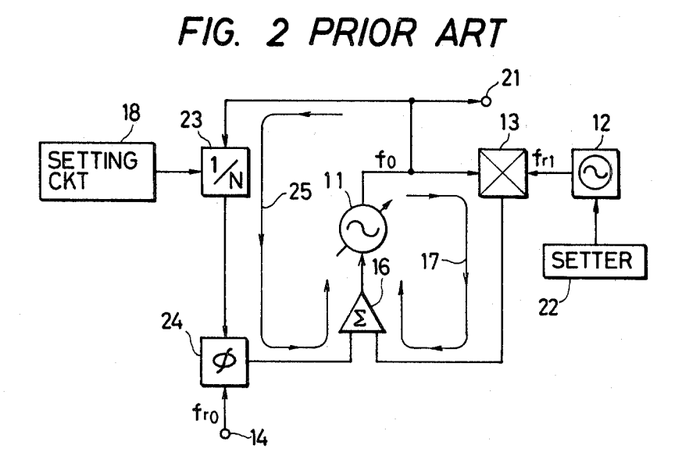
FIG. 2 is a block diagram showing a frequency synthesizer which can be generally deduced from the prior art.

It is considered that such problems could be solved by the use of a frequency synthesizer such, for example, as shown in FIG. 2. In FIG. 2, the output from the VCO 11 is frequency divided by a frequency divider 23 down to 1/N and its output is provided to a phase comparator 24, wherein it is phase compared with the reference signal from the terminal 14, and the phase-compared output is supplied to the adder 16. As the phase comparator 24, use is made of a digital phase comparator which has a wide capture range. On the other hand, the frequency converter 13 is operated as a phase comparator, i.e. as an analog phase comparator and its output is supplied to the adder 16. The frequency dividing factor N of the frequency divider 23 is changed by the setter 18 and the set frequency $f_{r1}$ of the frequency signal generator 12 is altered correspondingly. As a result of this, the output frequency $f_0$ at the output terminal 21 becomes $Nf_{r0}$.

Since the phase comparator 24 is of the digital type, a phase control loop 25 formed via the illustrated route [VCO 11–frequency divider 23–phase comparator 24–adder 16–VCO 11] has a wide capture range. Accordingly, even if a frequency appreciably distant from the oscillation frequency of the VCO 11 is set by the setter 18, the PLL 17 becomes locked-in without fail though it may take much time and, in such a state, the PLL 17 operates so that the oscillation frequency of the VCO 11 may be synchronized with the output from the frequency signal generator 12. Since the phase comparator 13 is of the analog type, the PLL 17 is relatively small in capture range but large in loop gain; therefore, the pull-in operation by the PLL 17 solves the problem of the poor noise characteristic which is raised in the case of using the PLL 25 alone.

Figure 1:
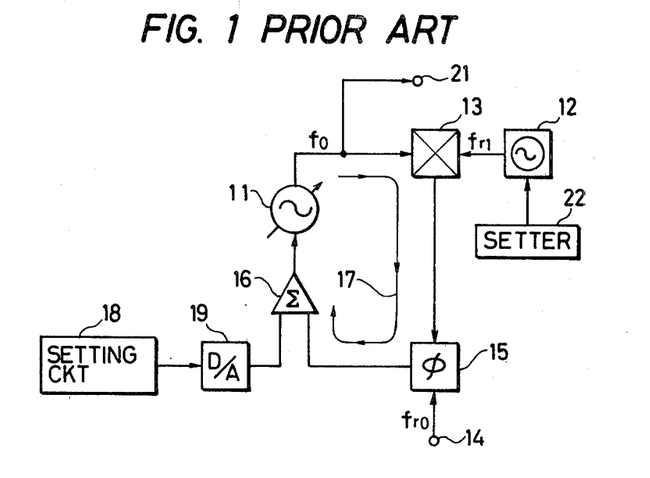
FIG. 1 is a block diagram showing a conventional frequency synthesizer.

The circuit of FIG. 2 is free from the problems of such nonlinear characteristic and hysteresis as referred to previously in respect of FIG. 1. However, when it is desired to vary the output frequency $f_0$ with narrow frequency steps over a wide range, it is necessary to enlarge the frequency dividing factor N of the frequency divider 23 and to lower the frequency $f_{r0}$ of the reference signal at the terminal 14; but, there are limits in these points. In addition, it is also necessary to lower the cutoff frequency of a loop filter included in the loop 25, resulting in the defect of the pull-in period becoming long.

Figure 3:
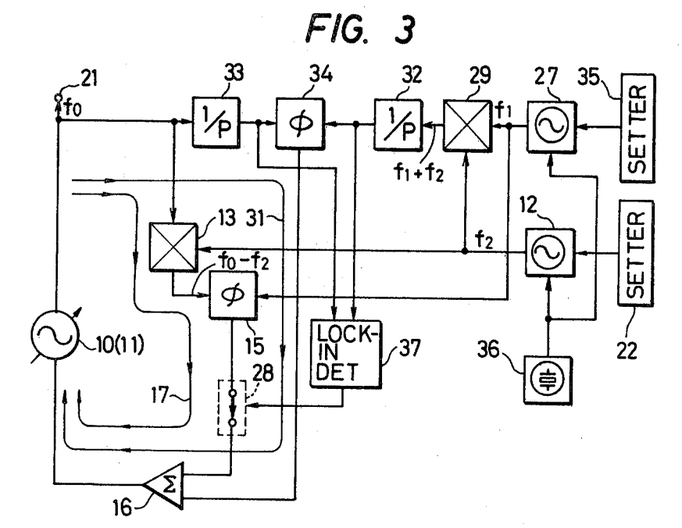
FIG. 3 is a block diagram illustrating an embodiment of the frequency synthesizer of the present invention.

FIG. 3 illustrates an embodiment of the frequency synthesizer of the present invention. In FIG. 3, the parts corresponding to those in FIG. 1 are identified by the same reference numerals. The output from the VCO 11 serving as the variable frequency oscillating means 10 is frequency converted by the output from the frequency signal generator 12 in the frequency converter 13 and a signal of the difference frequency is supplied to the phase comparator 15. In the phase comparator 15 the output from the frequency converter 13 is phase compared with the output of a frequency $f_1$ from another frequency signal generator 27 and the phase-compared output is applied to the VCO 11 to control it. That is to say, the output from the phase comparator 15 is provided via a switch 28 to the adder 16. The PLL 17 is constituted via the illustrated route [VCO 11–frequency converter 13–phase comparator 15–adder 16–VCO 11] and the VCO 11 is controlled on the basis of the output from the frequency signal generator 27.

In this embodiment, the outputs from the frequency signal generators 12 and 27 are frequency converted by a frequency converter 29. What is called an SSB mixer is used as the frequency converter 29. As for the SSB mixer, reference be made, for instance, to L. J. Giacoletto, "Electronics Designers Handbook", second edition (1977), Mc. Hill Book Co., pp 22–55, "Single Sideband Modulator". From the SSB mixer 29 is obtained a signal of a frequency which is the sum of the output frequencies $f_1$ and $f_2$ of the frequency signal generators 12 and 27. A PLL 31 is set up which controls the VCO 11 on the basis of this sum-frequency signal. In order that a phase comparison may easily be effected in the loop 31 as required, the outputs from the SSB mixer 29 and the VCO 11 are frequency divided by frequency dividers 32 and 33, respectively, and the frequency-divided outputs are phase compared by a phase comparator 34. The phase-compared output therefrom is applied as a control signal to the VCO 11 via the adder 16. Thus, the PLL 31 is established via a the illustrated route [VCO 11–phase comparator 34–adder 16–VCO 11].

The frequencies of the output signals from the frequency signal generators 12 and 27 can be set by setters 22 and 35, respectively. As required, the frequency signal generators 12 and 27 are each supplied with the output from a high-stability reference oscillator 36 such, for example, as a crystal oscillator and, on the basis of the oscillator output, they yield signals of frequencies corresponding to the set values of the setters 22 and 35, respectively. Incidentally, the adder 16 includes what is called a loop filter. The phase comparator 15 is one that is commonly referred to as a balanced mixer type phase comparator or analog phase detector. The PLL 17, while in its locked-in state, is of high gain and low noise. The phase comparator 34 is referred to as a frequency comparator, which corresponds, for instance, to MC4044 by Motorola Inc. or 11C44 by Fairchild Inc. By the use of such phase comparators, the capture range is greatly enlarged. As the frequency signal generator 12 one can be employed such, for instance, as set forth in Vadin Manassewitsch, "Frequency Synthesizers Theory and Design", Wily Interscience Publication, 1976, pp 34–36, FIGS. 1-17. Also the frequency signal generator 27 can be constituted in the same manner as the frequency signal generator 12 but it is preferable to use the frequency signal generator utilized in our prior U.S. application "Frequency Synthesizer" filed on Dec. 16, 1981, having Ser. No. 331,291.

To set the output frequency at the output terminal 21, the switch 28 is turned OFF first and it is detected, for instance, by a lock-in detector 37 based on the two inputs to the phase detector 34 that the PLL 31 becomes locked-in, and then, by the detected ouput, the switch 28 is turned ON. Since the digital phase comparator 34, which is commercially available, usually has built therein a lock-in detector, the switch 28 is controlled by the output from the output terminal of the lock-in detector in this case. The PLL 31 operates in such a manner that the output frequencies $f_1 + f_2$ and $f_0$ of the mixer 29 and the VCO 11 may be equal to each other. On the other hand, the PLL 17 functions so that the difference, of $f_0 - f_2$, between the output frequencies $f_0$ and $f_2$ of the VCO 11 and the frequency signal generator 12 may become equal to the output frequency $f_1$ of the frequency signal generator 27. Consequently, the output frequency $f_0$ at the output terminal 21 becomes $f_1 + f_2$.

Figure 4:
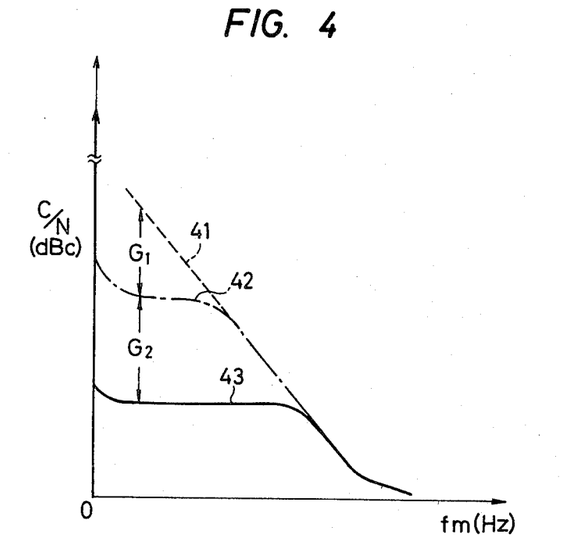
FIG. 4 is a graph showing noise components, with respect to set frequencies.

FIG. 4 shows the noise component with respect to a set frequency, the abscissa representing a frequency deviation $f_m$ with respect to the set frequency (0) and the ordinate the ratio of a carrier signal (a set-frequency signal) to noises (signals other than the carrier signal) in the output from the VCO 11 at each level. In the case of controlling the VCO 11 by a mere control voltage, that is, when neither of the PLLs 17 and 31 is constituted, the noise level gradually lowers as the frequency $f_m$ becomes higher than the set frequency ($f_m = 0$), as indicated by the curve 41. In the case where only the PLL 31 is set up but the PLL 17 is not formed, the C/N ratio improves by its loop gain $G_1$ as indicated by the curve 42. Further, when the PLLs 17 and 31 are both established, the C/N ratio further improves by the loop gain $G_2$ of the PLL 17 as indicated by the curve 43. The noise obtained with the characteristic of the curve 43 becomes equivalent to an SSB phase noise which is yielded when reference signals, that is, the outputs from the two frequency signal generators 12 and 27 are applied to the SSB mixer 29; as a result, a high-frequency-purity output of low noise is provided at the terminal 21.

Figure 5:
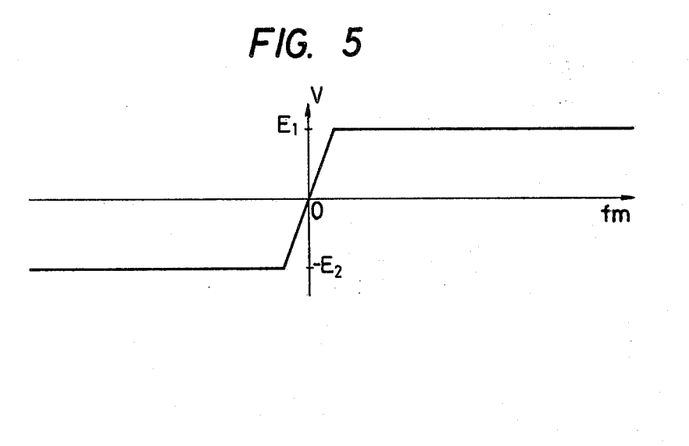
FIG. 5 is a graph showing the output-frequency characteristic of a digital phase comparator.

FIG. 5 shows the relationships of the frequency deviation $f_m$ with respect to the reference frequency and the phase-compared output of the digital phase comparator 34.

As the frequency deviation $f_m$ increases, the phase-compared output increases and finally it is saturated as shown. But even if the deviation $f_m$ is large, a saturated output $E_1$ or $-E_2$ is being generated, so that even though the set frequencies of the setters 22 and 35 are far apart from the output frequency of the VCO 11, the latter frequency is pulled in by the pull-in operation of the PLL 31. In this way, the pull-in operation can be performed over a wide frequency range. On top of that, after the pull-in operation, the PLL 17 operates to provide a high-purity output at the terminal 21.

Moreover, by making narrow the steps for varying the output frequency $f_1$ of the one frequency signal generator, for example, 27 by the setter 35 and by making wide the steps for varying the output frequency $f_2$ of the other frequency signal generator 12 by the setter 22, it is possible to vary the oscillation frequency of the VCO 11 with narrow steps over a wide frequency range.

Figure 6:
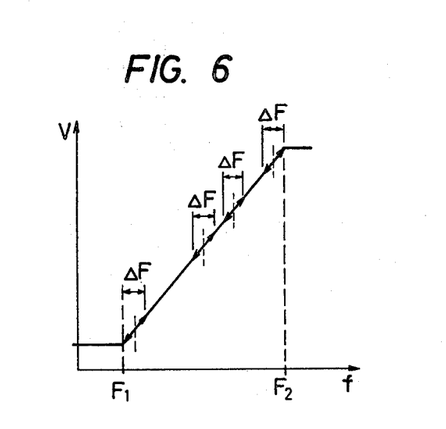
FIG. 6 is a graph showing the relationship between the capture ranges of first and second phase lock loops.

For instance, in the case where the capture range of the PLL 17 is $\Delta F$ when the PLL 31 covers a frequency range from $F_1$ to $F_2$ as shown in FIG. 6, the center of the pull-in operation of the PLL 17 can always be brought into agreement with the set frequency by effecting the pull-in operation of the PLL 31 with the switch 28 held in the OFF state first and then turning ON the switch 28. In other words, it is possible to carry out the pull-in operation of the PLL 17 with its maximum loop gain, producing a stable output. In FIG. 6, the ordinate represents the control voltage for the VCO 11.

In the case where the frequency variation by the setter 35 is effected with narrow frequency steps and the frequency variation by the setter 22 is carried out with wide steps as described above, since the difference frequency $f_0 - f_2$ can be made sufficiently low with respect to the frequencies $f_0$ and $f_2$, it is possible to employ a low-pass filter of a fixed cutoff frequency as a filter provided in the frequency converter 13 for taking out the $f_0 - f_2$ component. Besides, when using the SSB mixer as the frequency converter 29, the frequency components $f_2 - f_1$ and $f_2$ are lower in level than the frequency component $f_1 + f_2$ desired to be output and there is no particular need of providing a filter on the output side of the frequency converter 29. In the case where the SSB mixer is not employed as the frequency converter 29, if the output frequency of the frequency signal generator 12 is greatly varied by the setter 22, it may sometimes be necessary that the center frequency of the filter in the frequency converter be varied correspondingly.

It is also possible to omit the switch 28 and to supply the output from the phase comparator 15 to the adder 16 at all times. If the set frequencies of the setters 22 and 35 are far apart from the oscillation frequency of the VCO 11, then the frequency difference between the two inputs to the analog phase comparator 15 is large and the output therefrom is zero, resulting in no pull-in operation being conducted by the PLL 17. By the pull-in operation of the PLL 31, the frequencies of the two inputs to the phase comparator 15 approach each other, thereby causing the PLL 17 to perform the pull-in operation. At this time, the frequencies of the two inputs to the phase comparator 15 coincide with each other according to the pull-in state but their phase difference does not always become 90°, instead, in some cases, it becomes stable at 0° or 180°. The loop gain of the PLL 17 is maximum when the abovesaid phase difference is 90°. Accordingly, if the phase difference becomes stable at 0° or 180°, the loop gain of the PLL 17 does not become the maximum, degrading the C/N ratio. Through the use of the switch 28, however, the PLL 17 can reach the locked-in state with the maximum loop gain at all times. For this reason, it is preferable to employ the switch 28.

Figure 7:
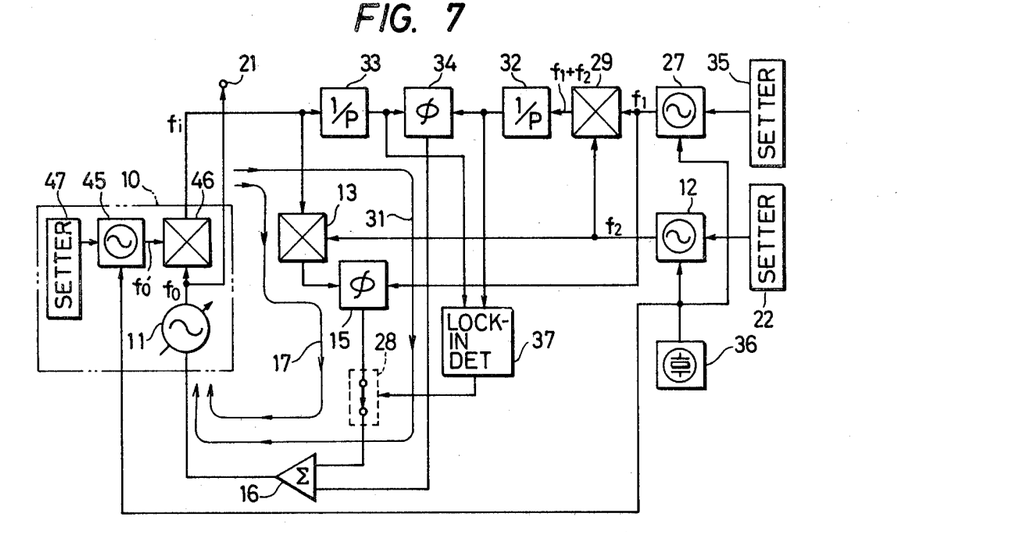
FIG. 7 is a block diagram illustrating a modification of the embodiment of FIG. 3 in which variable frequency oscillating means is modified.

In the PLL 17 the oscillation frequency $f_0$ of the VCO 11 need not necessarily be $f_1+f_2$. For instance, the frequency-converted output $f_i$ of the oscillation frequency $f_0$ of the VCO 11 may be supplied to the frequency converter 13 and the frequency divider 33. This can be achieved by such an arrangement, for example, as shown in FIG. 7, in which the output of a frequency $f_0'$ from a frequency signal generator 45 and the output of the frequency $f_0$ from the VCO 11 are provided to a frequency converter 46 in a variable frequency oscillating means 10 to obtain a signal of the difference frequency, $f_0 - f_0' = f_i$, and the signal of the frequency $f_i$ is applied as the output from the variable frequency oscillating means 10 to the mixer 13 and the frequency divider 33. This is the case in which the frequency signal generator 45 is also supplied with the output from the reference oscillator 36 to yield a signal of a frequency corresponding to the setting of the setter 47.

For example, the VCO 11 is constituted by a YIG oscillator oscillating at 2400 to 4200 MHz and the frequency signal generator 45 is arranged so that its output frequency $f_0'$ varies from 2180 to 3880 MHz by steps of 100 MHz. Consequently, the output frequency $f_i$ of the frequency converter 46 ranges from 220 to 320 MHz. The frequency signal generator 12 is designed so that its output frequency $f_2$ varies over the range of from 200 to 299.99 MHz by steps of 10 KHz, while the frequency signal generator 27 is adapted so that its output frequency $f_1$ varies from 20 to 20.009999 MHz by steps of 1 Hz. The frequency dividers 32 and 33 frequency divide their inputs down to 1/200. The oscillation frequency of the reference oscillator 36 is selected to be 10 MHz.

With such an arrangement, it is possible to vary the output frequency $f_0$ at the output terminal 21 from 2400 to 4200 MHz by steps of 1 Hz. In this case, as for the frequency signal generator 27, it is sufficient to vary its output frequency by steps of 1 Hz over a frequency range of 10 KHz relative to 20 MHz as described above and the output frequency $f_2$ of the frequency signal generator 12 is varied over a range of 200 MHz by steps of 10 KHz. These frequency variations can be effected relatively easily on account of their variation steps, variation ranges and center frequencies. Further, in this case, as referred to previously, it is possible to lock the oscillation frequency of the VCO 11 into the set frequency regardless of such nonlinearity and hysteresis of the oscillation frequency-control voltage characteristic of the VCO 11 as mentioned in respect of FIG. 1. The frequency $f_0'$ is set by a setter 47 every 100 MHz and, simultaneously with this setting, a corresponding DC voltage is applied to the adder 16.

As described previously, analog and digital phase comparators are employed as the phase comparators 15 and 34, respectively. The analog phase comparator usually yields no output when the two input signals thereto are of the same frequency and are phased 90° apart. On the other hand, the digital phase comparator usually generates no output when the two input signals coincide in frequency and in phase. Accordingly, if the set frequencies of the setters 22 and 35 are altered for changing the output frequency in the arrangement shown in FIGS. 3 or 7, then the lock-in detector 37 detects the non-locked-in state and, by the detected output, the switch 28 is turned OFF, putting only the PLL 31 in its lock-in operation. As a result of this, the locked-in state is set up by the PLL 31 and the switch 28 is turned ON by the output from the lock-in detector 37.

Immediately before the switch 28 is turned ON, the phase difference is zero between the two input signals to the phase comparator 34, so that upon turning ON the switch 28, the phase comparator 15 yields a relatively large output. When the VCO 11 has been controlled by this output, the two input signals to the phase comparator 34 are made to have phases apart from each other and its output acts to correct the change in the oscillation frequency of the VCO 11. That is to say, there is the possibility that the VCO 11 is controlled by the phase comparators 15 and 34 alternately, resulting in the state of the output from the VCO 11 being phase modulated at low frequencies.

In order to eliminate this possibility, two substantially identical signal generating means are employed as the frequency signal generator which is used in common to the two PLLs for generating the reference signal. One of the signal generating means is utilized for the PLL of a wide capture range and the other for the PLL of a narrow capture range. When the locked-in state has been established by the PLL of the wide capture range while the other PLL is in its pull-in operation, the phase of the frequency signal generating means for the PLL of the wide capture range is controlled by the phase-compared output in the PLL of the narrow capture range, preventing the phase comparator of the former PLL from yielding an output.

Figure 8:
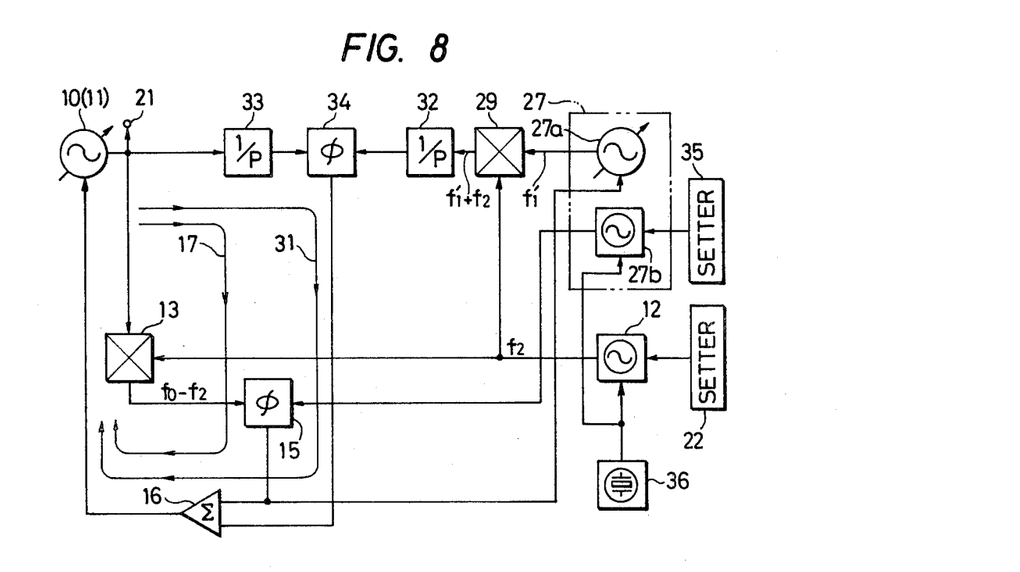
FIG. 8 is a block diagram illustrating another modification of the embodiment of FIG. 3 which is so arranged as to prevent phase variations.

FIG. 8 illustrates, by way of example, an application of this idea to the embodiment of FIG. 3. In FIG. 8, the parts corresponding to those in FIG. 3 are identified by the same reference numerals. The frequency signal generator 27 common to the two PLLs 17 and 31 is constituted by two frequency signal generating means 27a and 27b. In this case, the one frequency signal generating means 27a may be a simple voltage-controlled oscillator. The other frequency signal generating means 27b is identical in construction with the frequency signal generator 27 used in the embodiment of FIG. 3. The frequency signal generating means 27b is set by the setter 35 to a frequency on the basis of the reference signal from the reference oscillator 36. The center frequency of the output from the frequency signal generating means 27a is selected to be substantially equal to the center frequency of the frequency range of the frequency signal generating means 27b which is settable by the setter 35. For the PLL 31 is used the frequency signal generating means 27a and its output is applied to the frequency converter 29, whereas the output from the frequency signal generating means 27b is provided to the phase comparator 15. The switch 28 utilized in the embodiment of FIG. 3 is left out and the output from the phase comparator 15 is always supplied to the adder 16. With the arrangement described above, when the set frequency has been greatly changed by the setter 22, the PLL 17 gets out of its capture range. That is to say, the output from the phase comparator 15 becomes zero and the pull-in operation is performed first by the PLL 31 alone. When the PLL 31 has been put in its locked-in state or approaches the locked-in state, the phase comparator 15 also yields an output and, by this output, too, the VCO 11 is controlled and, at the same time, the frequency signal generating means 27a and 27b are also controlled in frequency and phase to function so that the outputs from the phase comparators 15 and 34 are reduced to zero, thus eliminating the possibility of the output phase of the VCO 11 being modulated at low frequencies. Incidentally, when the setting of the setter 35 has been changed with the setting of the setter 22 being held unchanged, the locked-in state is set up by the PLL 17 alone. At this time, the frequency signal generating means 27a is also controlled by the output from the phase comparator 15 and, as a result of this, the output from the frequency signal generating means 27a becomes equal in frequency to the output from the frequency signal generating means 27b. Consequently, the frequency range over which the frequency signal generating means 27a is controlled corresponds to ΔF shown in FIG. 6.

Figure 9:
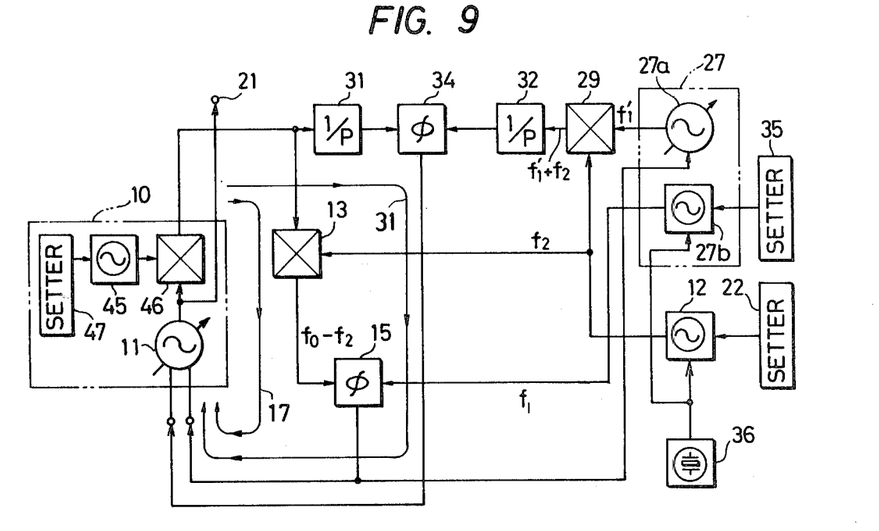
FIG. 9 is a block diagram showing a modified form of the example of FIG. 7 which is designed to be free from the phase variation.

It will be easily understood that the idea described with respect to FIG. 8 is also applicable to the embodiment of FIG. 7. FIG. 9 shows this example. In FIG. 9, the parts corresponding to those in FIG. 7 and 8 are identified by the same reference numerals but no detailed description will be repeated in respect of this example. As depicted in FIG. 9, the outputs from the phase comparators 15 and 34 may also be applied directly to the VCO 11 without passing through the adder 16. That is to say, for example, in the case of employing a YIG oscillator as the VCO 11, it is sufficient to provide two magnetic field coils for frequency control use and to individually supply the outputs from the phase comparators 15 and 34 to the coils. When a variable capacity diode is used as the VCO 11, it is possible to provide two control terminals for controlling the capacitance of the variable capacitance diode and to apply the outputs from the phase comparators 15 and 34 to the terminals respectively.

Figure 10:
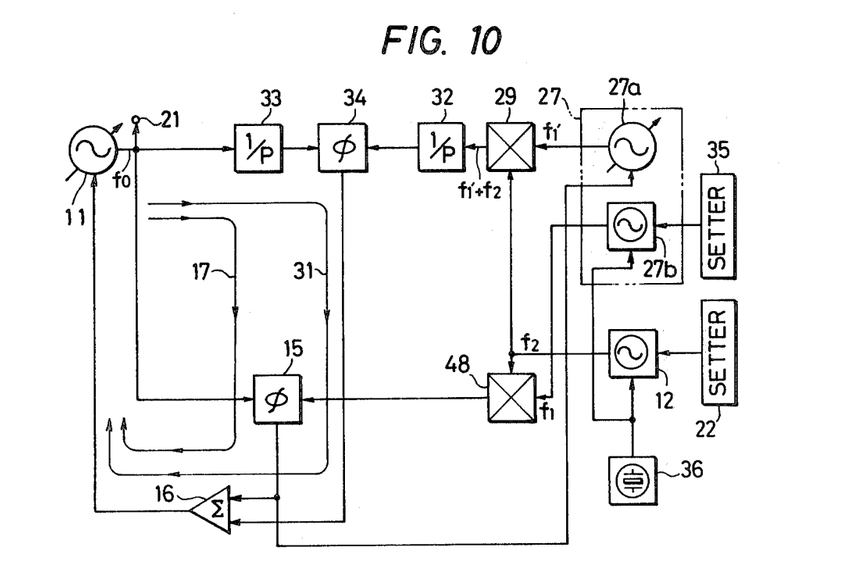
FIG. 10 is a block diagram showing another modified form of the embodiment of FIG. 3 which is designed so that the output from the variable frequency oscillating means is applied directly to a second phase comparator and the phase variation is prevented.

While in the foregoing embodiments the phase comparison in the phase comparator 15 of the PLL 17 is carried out after lowering the output frequency of the VCO 11 by the frequency converter 13, it is also possible to effect the phase comparison at high frequencies without lowering the output frequency of the VCO 11. For example, as illustrated in FIG. 10 in which the parts corresponding to those in FIG. 8 are marked with the same reference numerals, the output from the VCO 11 is applied to the frequency divider 33 and directly to the phase comparator 15. In this case, the output from the frequency signal generating means 27b is frequency converted by the outputs from the frequency signal generating means 12 at a frequency converter 48, obtaining a signal of a frequency $f_1+f_2$ corresponding to the sum of the two output frequencies. The frequency-converted output thus obtained is applied as a reference signal to the phase comparator 15. With such an arrangement, letting the output frequency of the frequency signal generating means 27a be represented by $f_1'$, the output frequency $f_0$ of the VCO 11 is so controlled by the operation of the PLL 31 as to satisfy $f_0/P=(f_1'+f_2)/P$ and, as a result, the output frequency $f_0$ of the VCO 11 gets into the capture range of the PLL 17. Then, the output frequency $f_0$ is controlled by the operation of the PLL 17 so that $f_0=f_1+f_2$ and, at the same time, the frequency signal generating means 27a is controlled by the output from the phase comparator 15, providing $f_1'=f_1$.

Figure 11:
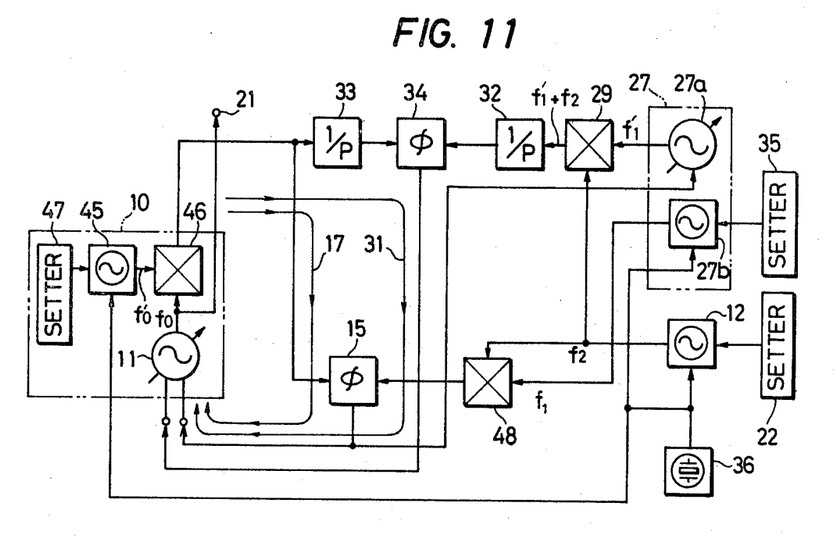
FIG. 11 is a block diagram illustrating a modification of the embodiment of FIG. 10 in which the variable frequency oscillating means is modified.

The idea described above in respect of FIG. 10 is also applicable to the embodiment of FIG. 7, in which case the output from the frequency converter 46 is supplied to the phase comparator 15 and the frequency divider 33 as depicted in FIG. 11.

Figure 12:
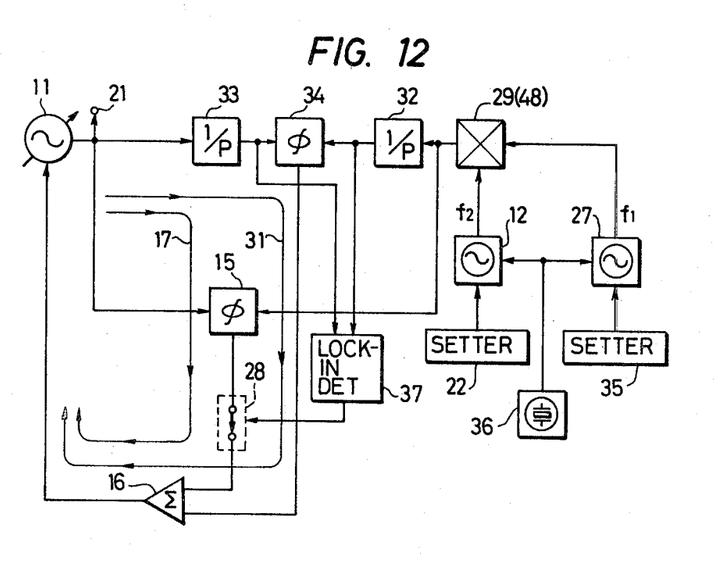
FIG. 12 is a block diagram illustrating another modified form of the embodiment of FIG. 10 in which no phase variation preventing means is provided.

Also, it is possible to apply the output from the VCO 11 directly to the phase comparator 15 and to supply output from the frequency signal generator 27 after frequency conversion by the output from the frequency signal generator 12. An example of the arrangement therefor is shown in FIG. 12 in which the parts corresponding to those in FIGS. 3 and 10 are indicated by the same reference numerals. The output from the VCO 11 is provided directly to the phase comparator 15 and the frequency divider 33 and the outputs from the frequency signal generators 12 and 27 are fed to the frequency converter 29, the converted output from which is applied to the phase comparator 15 and the frequency divider 32. The frequency converter 29 also performs the function of the frequency converter 48 in FIG. 10.

Although in the foregoing either of the frequency converters 29 or 48 yields a frequency of the sum of the inputs thereto, it is also possible to obtain a frequency of the difference between the two inputs. In such a case, the frequency converter 13 is adapted to provide a frequency of the sum of the two inputs thereto. Furthermore, the SSB mixers used as the frequency converters 29 and 48 may also be replaced with an ordinary frequency mixer and a filter for taking out a desired frequency component from the frequency mixer output. In this case, the filter for selecting the desired frequency component as required is constituted as a variable bandpass filter and the center frequency of its pass band is altered each time the output frequency of the VCO 11 is changed. At this time, second-order components $f_1 \pm f_2$ occur at substantially the same level but these high-order components are appreciably suppressed by the frequency division by the frequency dividers 32 and 33, and hence they do not obstruct the operation of the PLL 31. The frequency dividers 32 and 33 are provided for facilitating the comparing operation of the phase comparator 34 and if it is capable of achieving the comparison at high frequencies, these frequency dividers can be omitted.

It will be apparent that many modifications and variations may be effected without departing from the scope of the novel concepts of this invention.

I claim:

1. A frequency synthesizer for generating a signal of a set frequency, comprising:

variable frequency oscillating means the output frequency of which is controlled by a control signal;

first frequency signal generating means for generating a first frequency signal of a set frequency;

first frequency setting means connected to the first frequency signal generating means for setting the frequency of the first frequency signal;

second frequency signal generating means for generating a second frequency signal of a reference frequency;

a first frequency converter connected to the first and second frequency signal generating means for frequency converting the first and second frequency signals therefrom relative to each other;

a first phase comparator connected to the outputs of the variable frequency oscillating means and the first frequency converter for phase comparing the outputs therefrom, the compared output from the first phase comparator being applied as said control signal to the variable frequency oscillating means thereby constituting a first phase lock loop which operates so as to make the output frequency of the variable frequency oscillating means coincide with the output frequency of the first frequency converter, and the first phase comparator being capable of performing the phase comparing operation even if the frequency difference between the two inputs thereto is relatively large, wherein an enlarged capture range of the first phase lock loop is provided;

a second frequency converter connected to the output of (i) a selected one of the variable frequency oscillating means and the second frequency signal generating means and (ii) the output of the first frequency signal generating means, for frequency converting the two respective outputs thereform relative to each other; and a second comparator connected to the output of the second frequency converter and the output of the non-selected one of the variable frequency oscillating means and the second frequency signal generating means, for phase comparing the outputs therefrom, the output from the second phase comparator being applied as a control signal to the variable frequency oscillating means, thereby constituting a second phase lock loop which operates so as to make the frequencies of the two inputs to the second phase comparator coincide with each other, the second phase comparator being capable of performing the phase comparing operation with a narrower range of the frequency difference between the two inputs thereto as compared with the frequency difference between the two inputs to the first phase comparator, wherein the second phase lock loop is narrower in its capture range but larger in its loop gain than the first phase lock loop.

2. A frequency synthesizer according to claim 1 further comprising lock-in detector means connected to both inputs of the first phase comparator for detecting when both inputs thereto are in the locked-in state, and switching means connected between the output of the second phase comparator and the control input of the variable frequency oscillating means, the switching means being controlled by the output from the lock-in detector means so that when the first phase lock loop is in a non-locked-in state, the control of the variable frequency oscillating means by the output from the second phase comparator is suspended by the opening of the switching means, and so that when the first phase lock loop is substantially in a locked-in state, the control of the varible frequency oscillating means by the output from the second phase comparator is permitted by the closing of said switching means.

3. A frequency synthesizer according to claim 1 or 2 wherein a reference oscillator supplies a reference signal with a stable freqency to the first and second frequency signal generating means for respectively generating the first and second frequency signals, each having a stable frequency based on the stability of the frequency of the reference signal supplied from the reference oscillator.

4. A frequency synthesizer according to claim 2 wherein the variable frequency oscillating means comprises a variable frequency oscillator controlled by the outputs from the first and second phase comparators, third frequency signal generating means for generating a third frequency signal, and a third frequency converter connected to the outputs of the third frequency signal generating means and the variable frequency oscillator for converting the output frequency of the variable frequency oscillator and providing the converted output as the output from the variable frequency oscillating means.

5. A frequency synthesizer according to claim 4 wherein a reference oscillator supplies a reference signal with a stable frequency to the first, second and third frequency signal generating means to generate the first, second and third frequency signals, respectively, each having a stable frequency based on the stability of the frequency of the reference signal from the reference oscillator.

6. A frequency synthesizer according to claim 4 further comprising a third frequency setting means connected to the third frequency signal generating means for setting the frequency of the third frequency signal.

7. A frequency synthisizer according to claim 1, 2, 4 or 6 which further comprises a second frequency setting means connected to the second frequency signal generating means for setting the frequency of the second frequency signal, wherein the frequency of the second frequency signal is varied by the second frequency setting means with narrower frequency steps than the varying of the frequency of the first frequency signal by the first frequency setting means.

8. A frequency synthesizer according to claim 1 wherein the second frequency signal generating means comprises a first variable frequency signal generator the oscillation frequency of which is controlled by a respective control signal and the output of which is applied to the first frequency converter, and a second frequency signal generator for supplying a selected one of the second frequency converter or the second phase comparator with the second frequency signal of a frequency close to the output frequency of the first variable frequency signal generator, said synthesizer including means for controlling the output frequency of the first variable frequency signal generator by the output from the second phase comparator to make the output frequency substantially coincide with the output frequency of the second frequency signal generator.

9. A frequency synthesizer according to claim 8 wherein a reference oscillator provides a reference signal with a stable frequency to the first frequency signal generating means and the second frequency signal generator of the second frequency signal generating means to generate the first and second frequency signals, respectively, each having a frequency stability based on the stability of the frequency of the reference signal from the reference oscillator.

10. A frequency synthesizer according to claim 8 wherein the variable frequency oscillating means comprises a variable frequency oscillator controlled by the outputs from the first and second phase-comparators, third frequency signal generating means for generating a third frequency signal, and a third frequency converter connected to the outputs of the third frequency signal generating means and the variable frequency oscillator for converting the output frequency of the variable frequency oscillator and providing the converted output as the output from the variable frequency oscillating means.

11. A frequency synthesizer according to claim 10 wherein a reference oscillator provides a reference signal with a stable frequency to the first and third frequency signal generating means and the second frequency signal generator of the second frequency signal generating means to generate the first, third and second frequency signals, respectively, each having a stable frequency based on the stability of the frequency of the reference signal from the reference oscillator.

12. A frequency synthesizer according to claim 10 further comprising third frequency setting means connected to the third frequency signal generating means for setting the frequency of the third frequency signal.

13. A frequency synthesizer according to claim 9, 10, 11 or 12 which further comprises second frequency setting means connected to the second frequency signal generator of the second frequency signal generating means for setting the frequency of the second frequency signal, wherein the frequency of the second frequency signal may be varied by the second frequency setting means with narrower frequency steps than in the case of varying the frequency signal by the first frequency setting means.

14. A frequency synthesizer according to claim 1, 2, 4, 5, 6, 8, 9, 10 or 11 further comprising a first frequency divider connected in series between the output of the first frequency converter and the respective input of the first phase comparator for frequency dividing the input signal thereto, and a second frequency divider connected in series between the output of the variable frequency oscillating means and the other input of the first phase comparator for frequency dividing the input signal thereto, the frequency dividing ration of the second frequency divider being selected to be the same as that of the first frequency divider.

15. A frequency synthesizer according to claim 1, 2, 4, 5, 6, 8, 9, 10, 11 or 12 further comprising an adder connected between the outputs of each of the first and second phase comparators and the control input of the variable frequency oscillating means for adding the outputs from the two phase comparators and applying the added output as the control signal to the variable frequency oscillating means.

16. A frequency synthesizer according to claim 1, 2, 4, 5, 6, 8, 9, 10, 11 or 12 wherein the first frequency converter is an SSB mixer.

17. A frequency synthesizer according to claim 1 or 2 wherein the outputs from the variable frequency oscillating means and the first frequency converter are applied directly to the second phase comparator for phase comparison; wherein the second frequency converter is used also as the first frequency converter; wherein a second frequency setting means is connected to the second frequency signal generating means for setting the frequency of the second frequency signal; and wherein the frequency of the second frequency signal may be varied by the second frequency setting means with narrower frequency steps than the varying of the frequency of the first frequency signal by the first frequency setting means.

* * * * *